United States Patent
Pinarbasi

(10) Patent No.: US 6,201,672 B1
(45) Date of Patent: Mar. 13, 2001

(54) SPIN VALVE SENSOR HAVING IMPROVED INTERFACE BETWEEN PINNING LAYER AND PINNED LAYER STRUCTURE

(75) Inventor: Mustafa Pinarbasi, Morgan Hill, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/299,336

(22) Filed: Apr. 26, 1999

(51) Int. Cl.$^7$ .......................................................... G11B 5/39
(52) U.S. Cl. .................................... 360/324.11; 360/324.1
(58) Field of Search ........................ 360/317, 324.1, 360/324.11, 324.12, 324.2

(56) References Cited

U.S. PATENT DOCUMENTS

| | | | |
|---|---|---|---|
| 5,889,640 | * 3/1999 | Hayashi et al. | 360/324.1 |
| 5,909,345 | * 6/1999 | Kawawake et al. | 360/324.1 |
| 6,038,107 | * 3/2000 | Pinarbasi | 360/324.11 |
| 6,040,961 | * 3/2000 | Gill | 360/324.11 |
| 6,061,210 | * 5/2000 | Gill | 360/324.12 |
| 6,108,177 | * 8/2000 | Gill | 360/324.12 |

FOREIGN PATENT DOCUMENTS 11-74121  *  3/1999  (JP) .

* cited by examiner

*Primary Examiner*—Jefferson Evans
(74) *Attorney, Agent, or Firm*—Gray Cary Ware & Freidenrich LLP; Ervin F. Johnston

(57) ABSTRACT

A bilayer interlayer comprising first and second layers of cobalt iron (CoFe) and nickel iron (NiFe) respectively is located between a nickel oxide pinning layer and a cobalt iron (CoFe) pinned layer structure of a spin valve sensor. The pinned layer structure may be an antiparallel (AP) pinned layer structure or a single pinned layer of cobalt iron (CoFe). The bilayer interlayer reduces the coercivity of the cobalt iron (CoFe) pinned layer structure so that a magnetic moment of the pinned layer structure is returned to its original position by exchange coupling with the pinning layer when the magnetic moment is rotated to some direction other than the pinned direction. The spin valve sensor manifests an improved magnetoresistive coefficient (dr/R) and thermal stability.

39 Claims, 9 Drawing Sheets

CELL ARRAY PORTION

PERIPHERAL CIRCUIT PORTION

CELL ARRAY PORTION

PERIPHERAL CIRCUIT PORTION

PERIPHERAL CIRCUIT PORTION

CELL ARRAY PORTION

CELL ARRAY PORTION

PERIPHERAL CIRCUIT PORTION

CELL ARRAY PORTION | PERIPHERAL CIRCUIT PORTION

CELL ARRAY PORTION

PERIPHERAL CIRCUIT PORTION

SPIN VALVE SENSOR HAVING IMPROVED INTERFACE BETWEEN PINNING LAYER AND PINNED LAYER STRUCTURE

BACKGROUND OF THE INVENTION

1. Field of the Invention

The present invention relates to a read head with an improved interface between a pinning layer and a pinned layer structure of a spin valve sensor and, more particularly, to a bilayer interlayer structure between the pinning layer and the pinned layer which reduces its coercivity field ($H_c$) and increases its magnetoresistive (MR) coefficient.

2. Description of the Related Art

The heart of a computer is an assembly that is referred to as a magnetic disk drive. The magnetic disk drive includes a rotating magnetic disk, a slider that has write and read heads, a suspension arm that supports the slider above the rotating disk and an actuator that swings the suspension arm to place the read and write heads over selected circular tracks on the rotating disk. The suspension arm biases the slider into contact with the surface of the disk when the disk is not rotating but, when the disk rotates, air is swirled by the rotating disk adjacent an air bearing surface (ABS) of the slider causing the slider to ride on an air bearing a slight distance from the surface of the rotating disk. When the slider rides on the air bearing the write and read heads are employed for writing magnetic impressions to and reading magnetic impressions from the rotating disk. The read and write heads are connected to processing circuitry that operates according to a computer program to implement the writing and reading functions.

The write head includes a coil layer embedded in first, second and third insulation layers (insulation stack), the insulation stack being sandwiched between first and second pole piece layers. A gap is formed between the first and second pole piece layers by a nonmagnetic gap layer at an air bearing surface (ABS) of the write head. The pole piece layers are connected at a back gap. Current conducted to the coil layer induces a magnetic field into the pole pieces that fringes across the gap between the pole pieces at the ABS. The fringe field writes information in tracks on moving media, such as in circular tracks on a rotating disk.

In recent read heads a spin valve sensor is employed for sensing magnetic fields from the rotating magnetic disk. The sensor includes a nonmagnetic conductive layer, hereinafter referred to as a spacer layer, sandwiched between first and second ferromagnetic layers, hereinafter referred to as a pinned layer, and a free layer. First and second leads are connected to the spin valve sensor for conducting a sense current therethrough. The magnetization of the pinned layer is pinned perpendicular to an air bearing surface (ABS) of the head and the magnetic moment of the free layer is located parallel to the ABS but free to rotate in response to external magnetic fields. The magnetization of the pinned layer is typically pinned by exchange coupling with an antiferromagnetic layer.

The thickness of the spacer layer is chosen so that shunting of the sense current and a magnetic coupling between the free and pinned layers are minimized. This thickness is less than the mean free path of conduction electrons through the sensor. With this arrangement, a portion of the conduction electrons is scattered by the interfaces of the spacer layer with the pinned and free layers. When the magnetizations of the pinned and free layers are parallel with respect to one another, scattering is minimal and when the magnetizations of the pinned and free layers are antiparallel, scattering is maximized. Changes in scattering alter the resistance of the spin valve sensor in proportion to $\cos\theta$, where $\theta$ is the angle between the magnetizations of the pinned and free layers. In a read mode the resistance of the spin valve sensor changes proportionally to the magnitudes of the magnetic fields from the rotating disk. When a sense current is conducted through the spin valve sensor resistance changes cause potential changes that are detected and processed as playback signals by the processing circuitry.

The spin valve sensor is characterized by a magnetoresistive (MR) coefficient that is substantially higher than the MR coefficient of an anisotropic magnetoresistive (AMR) sensor. MR coefficient is dr/R were dr is the change in resistance of the spin valve sensor and R is the resistance of the spin valve sensor before the change. A spin valve sensor is sometimes referred to as a giant magnetoresistive (GMR) sensor. When a spin valve sensor employs a single pinned layer it is referred to as a simple spin valve.

Another type of spin valve sensor is an antiparallel (AP) pinned spin valve sensor. The AP pinned spin valve sensor differs from the simple spin valve sensor in that an AP pinned structure has multiple thin film layers instead of a single pinned layer. The AP pinned structure has an AP coupling layer sandwiched between first and second ferromagnetic pinned layers. The first pinned layer has its magnetic moment oriented in a first direction by exchange coupling to the antiferromagnetic pinning layer. The second pinned layer is immediately adjacent to the spacer layer and is antiparallel exchange coupled to the first pinned layer because of the minimal thickness (in the order of 8 Å) of the AP coupling film. Accordingly, the magnetic moment of the second pinned layer is oriented in a second direction that is antiparallel to the direction of the magnetic moment of the first pinned layer.

The AP pinned structure is preferred over the single pinned layer because the magnetic moments of the first and second pinned layers of the AP pinned structure subtractively combine to provide a net magnetic moment that is less than the magnetic moment of the single pinned layer. The direction of the net moment is determined by the thicker of the first and second pinned layers. A reduced net magnetic moment equates to a reduced demagnetization (demag) field from the AP pinned structure. Since the antiferromagnetic exchange coupling is inversely proportional to the net pinning moment, this increases exchange coupling between the first pinned layer and the pinning layer. The AP pinned spin valve sensor is described in commonly assigned U.S. Pat. No. 5,465,185 to Heim and Parkin.

The first and second pinned layers of the AP pinned structure are typically made of cobalt (Co). Unfortunately, cobalt has high coercivity, high magnetostriction and low resistance. When the first and second pinned layers of the AP pinned structure are formed they are sputter deposited in the presence of a magnetic field that is oriented perpendicular to the ABS. This sets the easy axis (e.a.) of the pinned layers perpendicular to the ABS. During a subsequent making of the magnetic head, the AP pinned structure is subjected to magnetic fields that are directed parallel to the ABS. These fields can cause the magnetic moment of the first pinned layer to switch from a desirable first direction perpendicular to the ABS to an undesirable second direction. The same occurs to the second pinned layer of the AP pinned structure. If the coercivity of the first pinned layer of the AP pinned structure is higher than the exchange coupling between the first pinned layer and the pinning layer the exchange coupling will not return the magnetic moment of the first pinned layer to its original direction. This ruins the read head. This problem can occur during operation of the magnetic head in a disk drive when a magnetic field stronger than the exchange field of the first pinned layer of the AP pinned structure is exerted on the read head.

Efforts continue to increase the MR coefficient (dr/R) of GMR heads. An increase in the MR coefficient equates to higher bit density (bits/square inch of the rotating magnetic disk) read by the read head. When these efforts are undertaken it is important that the coercivity ($H_c$) of the pinned layer next to the pinning layer not exceed the exchange coupling field therebetween.

SUMMARY OF THE INVENTION

I investigated a spin valve sensor with an AP pinned structure made of cobalt iron ($Co_{90}Fe_{10}$) and a spin valve sensor with a single pinned layer made of cobalt iron ($Co_{90}Fe_{10}$). Cobalt iron ($Co_{90}Fe_{10}$) has near zero magnetostriction and high resistance. The near zero magnetostriction means that any induced stress after lapping the magnetic head will not cause a stress induced anisotropy field. Anisotropy field is the amount of field required to rotate the magnetic moment of the pinned layer 90° from its easy axis. Stress induced anisotropy field is a product of magnetostriction and the induced stress. The aforementioned high resistance of the cobalt iron (CoFe) minimizes shunting of the sense current and thereby increases the read signal.

Unfortunately, the coercivity of the cobalt iron (CoFe) of the first AP pinned layer of the AP pinned structure or a single layer pinned layer is increased beyond the exchange coupling field between the first pinned layer and the pinning layer. This is particularly true when the pinning layer is nickel oxide (NiO). Nickel oxide (NiO) is desirable antiferromagnetic material for the pinning layer since it is an insulator. Unfortunately, however, nickel oxide (NiO) has a low blocking temperature. The blocking temperature is the temperature at which the magnetic spins of the pinned layer are free to rotate in the presence of a magnetic field applied to the pinned layer.

In my initial investigation I found that the coercivity ($H_c$) of a single pinned layer of cobalt iron (CoFe) was 500 oersteds (Oe) and the exchange coupling field between the nickel oxide (NiO) pinning layer and the pinned layer was only 350 Oe. Consequently, the exchange coupling field was not strong enough to overcome the coercivity and return the full magnetic moment of the pinned layer to its original direction after being switched to some other direction.

I found that by placing a bilayer interlayer structure between the pinning layer and the pinned layer the coercivity ($H_c$) of the pinned layer was significantly reduced from 500 Oe to 300 Oe and that the exchange coupling field increased to 400 Oe. Since the coercivity ($H_c$) of 300 Oe of the pinned layer was less than the exchange coupling field of 400 Oe the pinned layer was returned to its original position by the pinning layer when the magnetic moment of the pinned layer was switched by a magnetic field to some other direction. In investigating spin valve sensors with AP pinned layers I found that the magnetoresistive coefficient (dr/R) was increased when the bilayer interlayer was employed. This indicated that the exchange coupling field exceeded the coercivity ($H_c$) of the first AP pinned layer and returned the magnetic moment of the first AP pinned layer to its original position when subjected to a field 180° to the original direction. I also found that the bilayer interlayer structure improved the magnetoresistive coefficient (dr/R) of the simple spin valve sensor. Further, when the spin valve sensor was subjected to an annealing temperature of 230° C. for six hours and a resetting of the pinning layer the magnetoresistive coefficient (dr/R) was greater than a spin valve sensor without the bilayer interlayer. Accordingly, the thermal stability of the spin valve sensor was improved by the bilayer interlayer.

An object of the present invention is to reduce the coercivity ($H_c$) of a cobalt iron (CoFe) pinned layer structure and improve the magnetoresistive coefficient (dr/R) and thermal stability of a spin valve sensor that employs the pinned layer structure.

Another object is to provide a spin valve read head that has an improved magnetoresistive coefficient (dr/R), improved thermal stability and that is magnetically stable when subjected to stray magnetic fields.

A further object is to provide a spin valve read head wherein a pinned layer structure, that is exchange coupled to an antiferromagnetic (AFM) nickel oxide (NiO) pinning layer, has a coercivity ($H_c$) that is less than the exchange coupling field between the pinned layer structure and the pinning layer.

Still another object is to provide an AP pinned spin valve read head wherein a first AP pinned layer of an AP pinned structure, which is exchange coupled to an antiferromagnetic (AFM) nickel oxide (NiO) pinning layer, has a coercivity that is less than the exchange coupling field between it and the pinning layer.

Other objects and advantages of the invention will become apparent upon reading the following description taken together with the accompanying drawings.

DESCRIPTION OF THE PREFERRED EMBODIMENTS

Magnetic Disk Drive

Figure 1:
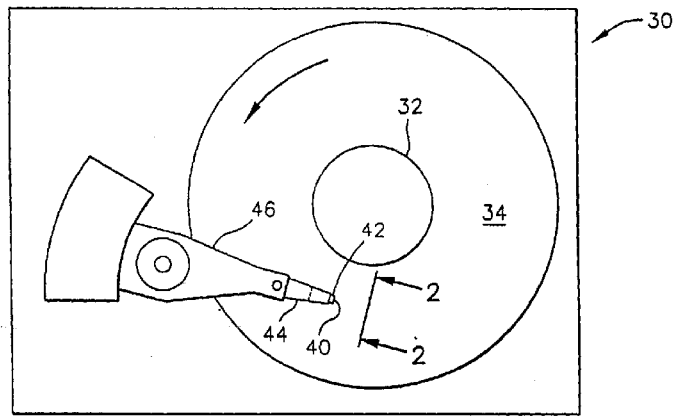
Figure 2:
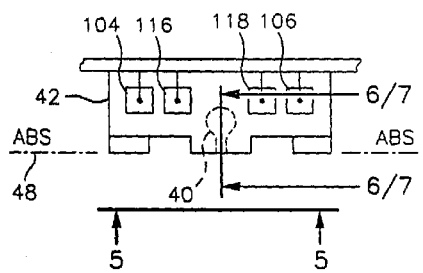
Figure 3:
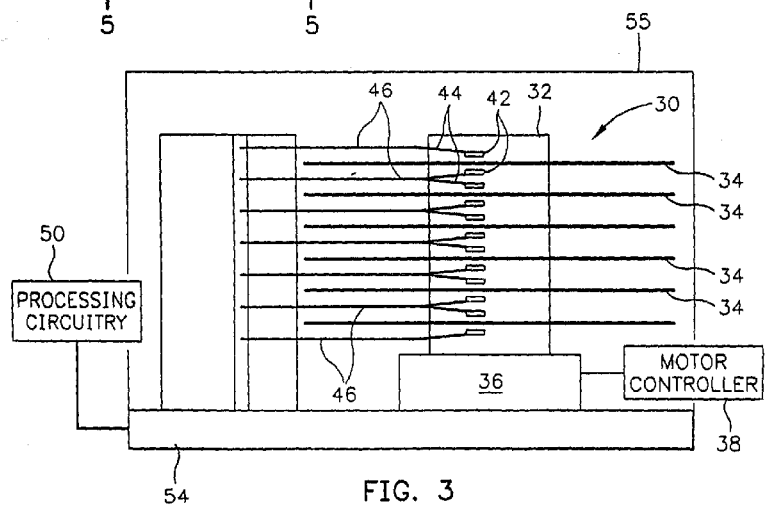
Figure 4:
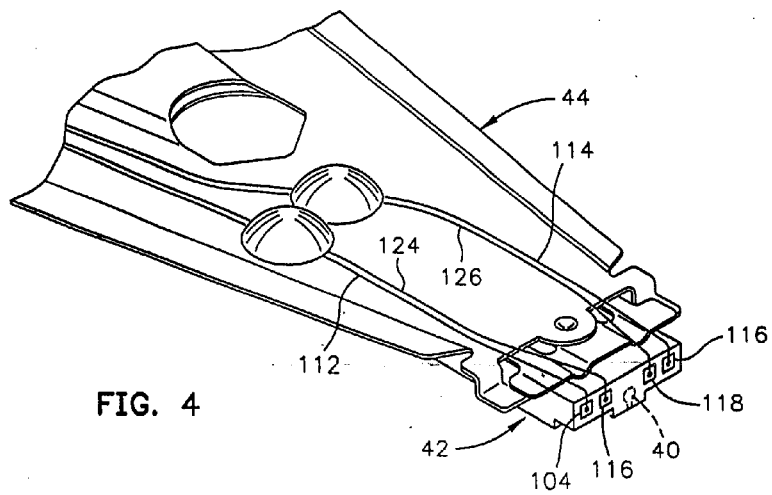

Referring now to the drawings wherein like reference numerals designate like or similar parts throughout the several views, FIGS. 1–3 illustrate a magnetic disk drive 30. The drive 30 includes a spindle 32 that supports and rotates a magnetic disk 34. The spindle 32 is rotated by a motor 36 that is controlled by a motor controller 38. A slider 42 with a combined read and write magnetic head 40 is supported by a suspension 44 and actuator arm 46. A plurality of disks, sliders and suspensions may be employed in a large capacity direct access storage device (DASD) as shown in FIG. 3. The suspension 44 and actuator arm 46 position the slider 42 so that the magnetic head 40 is in a transducing relationship with a surface of the magnetic disk 34. When the disk 34 is rotated by the motor 36 the slider is supported on a thin (typically, 0.05 μm) cushion of air (air bearing) between the surface of the disk 34 and the air bearing surface (ABS) 48. The magnetic head 40 may then be employed for writing information to multiple circular tracks on the surface of the disk 34, as well as for reading information therefrom. Processing circuitry 50 exchanges signals, representing such information, with the head 40, provides motor drive signals for rotating the magnetic disk 34, and provides control signals for moving the slider to various tracks. In FIG. 4 the slider 42 is shown mounted to a suspension 44. The components described hereinabove may be mounted on a frame 54 of a housing, as shown in FIG. 3.

Figure 5:
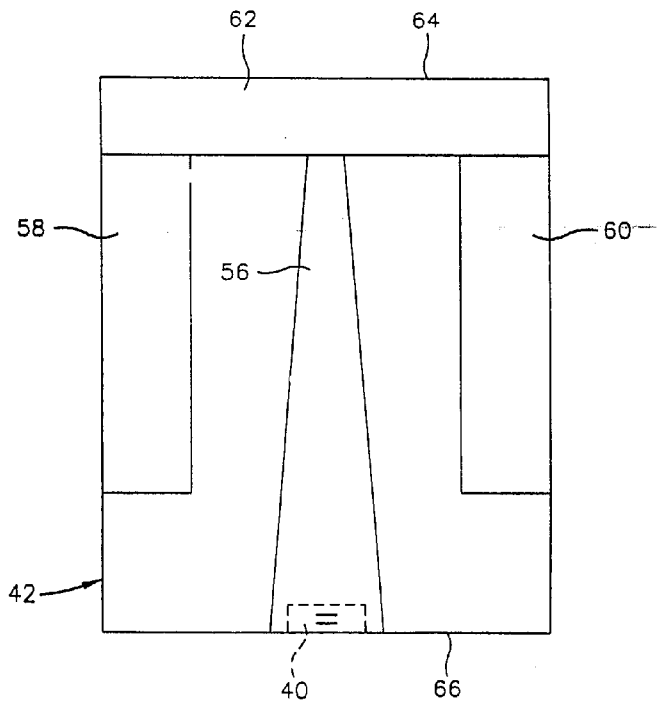
Figure 10:
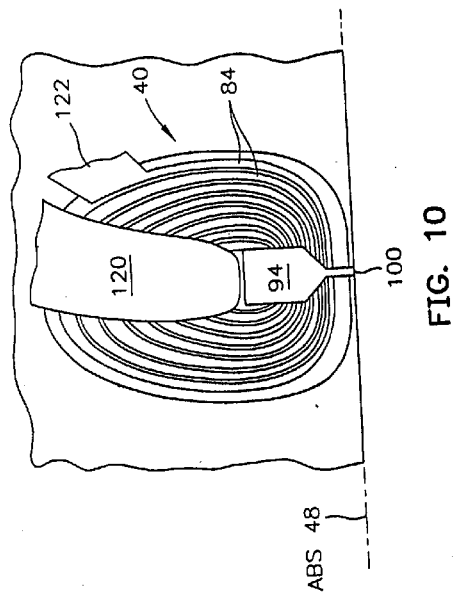

FIG. 5 is an ABS view of the slider 42 and the magnetic head 40. The slider has a center rail 56 that supports the magnetic head 40, and side rails 58 and 60. The rails 56, 58 and 60 extend from a cross rail 62. With respect to rotation of the magnetic disk 34, the cross rail 62 is at a leading edge 64 of the slider and the magnetic head 40 is at a trailing edge 66 of the slider.

Figure 1A:
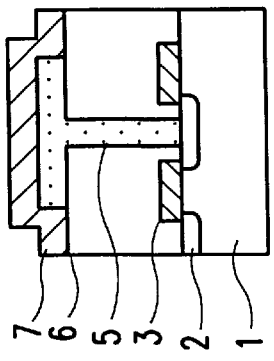
FIG. 1 is a plan view of an exemplary magnetic disk drive.
Figure 1B:
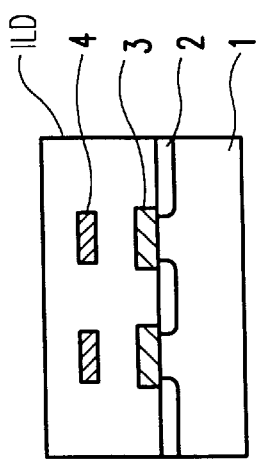
Figure 2A:
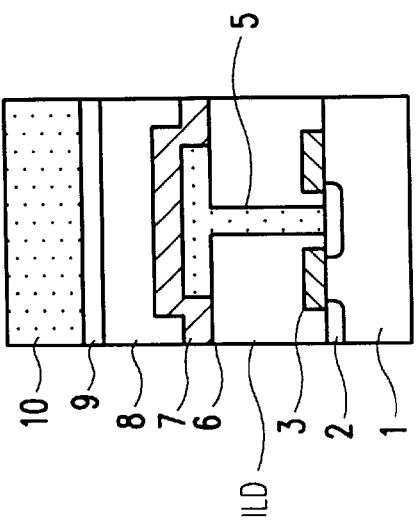
FIG. 2 is an end view of a slider with a magnetic head of the disk drive as seen in plane 2—2.
Figure 2B:
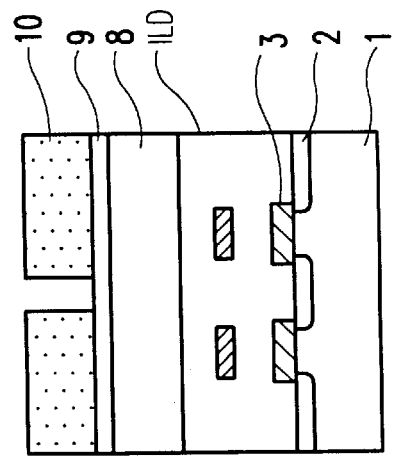
Figure 3B:
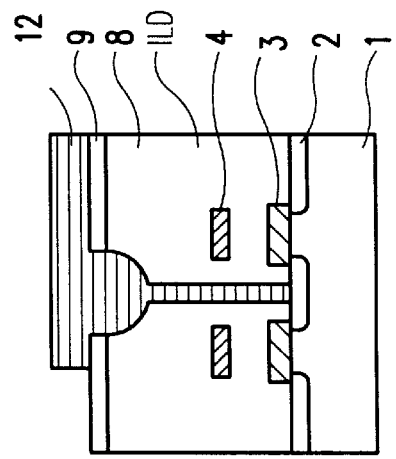
FIG. 3 is an elevation view of the magnetic disk drive wherein multiple disks and magnetic heads are employed.
Figure 4B:
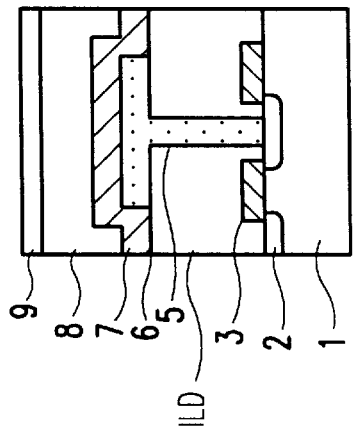
FIG. 4 is an isometric illustration of an exemplary suspension system for supporting the slider and magnetic head.
Figure 3A:
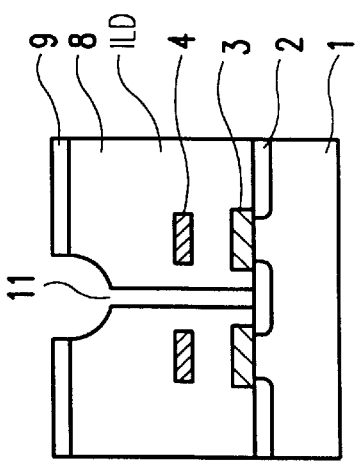
Figure 4A:
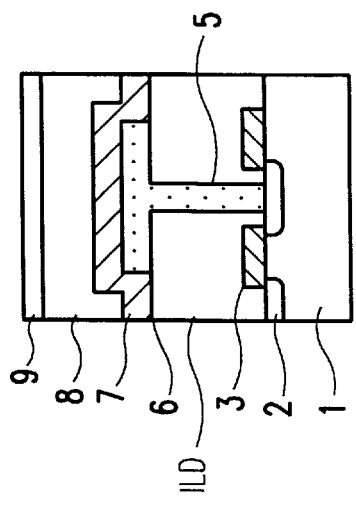
Figure 5A:
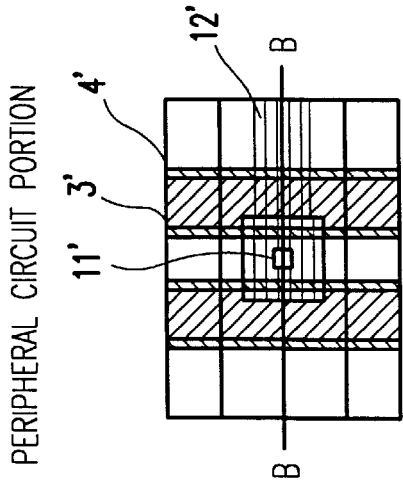
FIG. 5 is an ABS view of the magnetic head taken along plane 5—5 of FIG. 2.
Figure 5B:
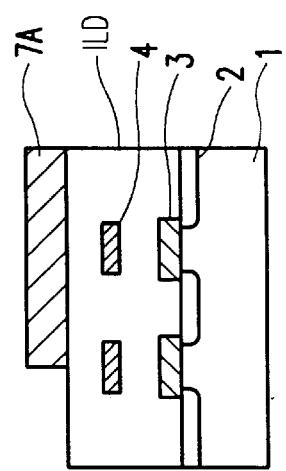
Figure 10A:
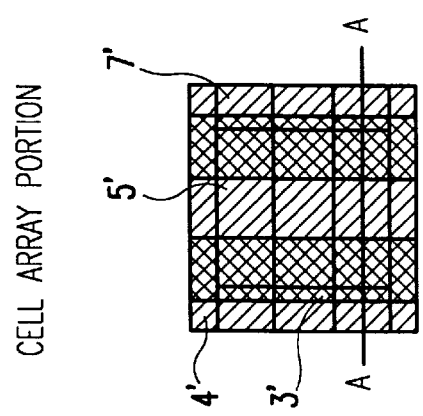
FIG. 10 is a view taken along plane 10—10 of FIGS. 6 or 7 with all material above the coil layer and leads removed.
Figure 10B:
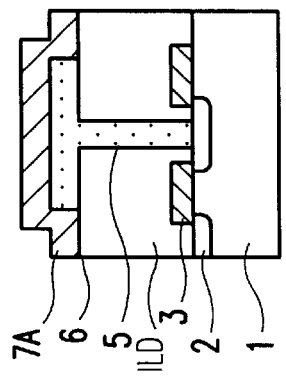
Figure 6A:
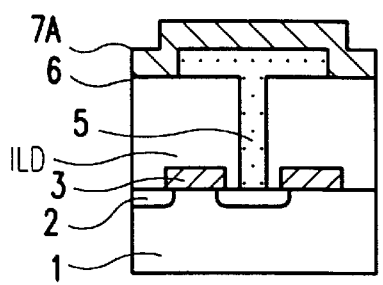
FIG. 6 is a partial view of the slider and a piggyback magnetic head as seen in plane 6—6 of FIG. 2.
Figure 6B:
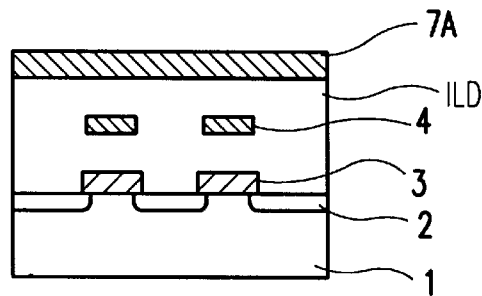
Figure 8:
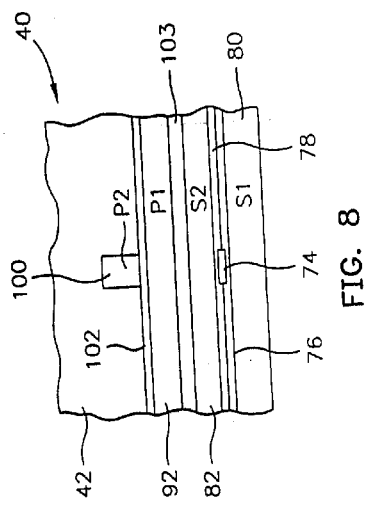

FIG. 6 is a side cross-sectional elevation view of a piggyback magnetic head 40, which includes a write head portion 70 and a read head portion 72, the read head portion employing a spin valve sensor 74 of the present invention. FIG. 8 is an ABS view of FIG. 6. The spin valve sensor 74 is sandwiched between nonmagnetic electrically insulative first and second read gap layers 76 and 78, and the read gap layers are sandwiched between ferromagnetic first and second shield layers 80 and 82. In response to external magnetic fields, the resistance of the spin valve sensor 74 changes. A sense current $I_s$ conducted through the sensor causes these resistance changes to be manifested as potential changes. These potential changes are then processed as readback signals by the processing circuitry 50 shown in FIG. 3.

The write head portion 70 of the magnetic head 40 includes a write coil layer 84 sandwiched between first and second insulation layers 86 and 88. A third insulation layer 90 may be employed for planarizing the head to eliminate ripples in the second insulation layer caused by the coil layer 84. The first, second and third insulation layers are referred to in the art as an "insulation stack". The coil layer 84 and the first, second and third insulation layers 86, 88 and 90 are sandwiched between first and second pole piece layers 92 and 94. The first and second pole piece layers 92 and 94 are magnetically coupled at a back gap 96 and have first and second pole tips 98 and 100 which are separated by a write gap layer 102 at the ABS. An insulation layer 103 is located between the second shield layer 82 and the first pole piece layer 92. Since the second shield layer 82 and the first pole piece layer 92 are separate layers this head is known as a piggyback head. As shown in FIGS. 2 and 4, first and second solder connections 104 and 106 connect leads from the spin valve sensor 74 to leads 112 and 114 on the suspension 44, and third and fourth solder connections 116 and 118 connect leads 120 and 122 from the coil 84 (see FIG. 8) to leads 124 and 126 on the suspension.

Figure 7A:
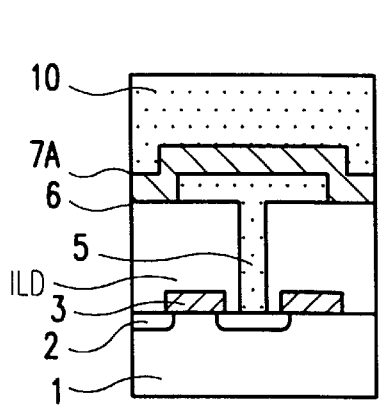
FIG. 7 is a partial view of the slider and a merged magnetic head as seen in plane 7—7 of FIG. 2.
Figure 7B:
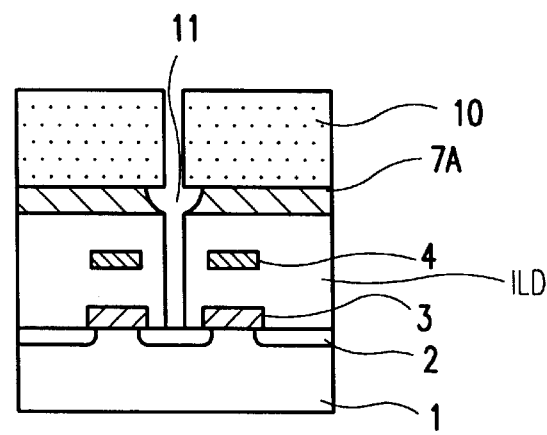
Figure 8A:
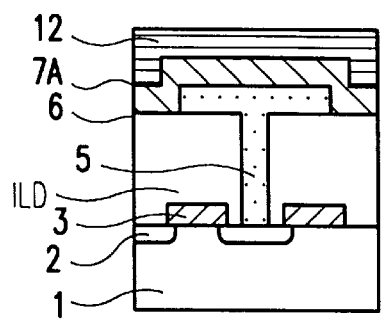
FIG. 8 is a partial ABS view of the slider taken along plane 8—8 of FIG. 6 to show the read and write elements of the piggyback magnetic head.
Figure 8B:
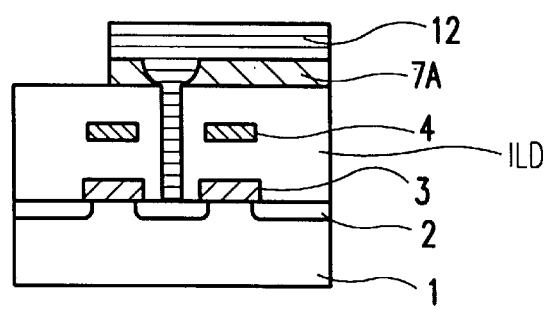
Figure 9A:
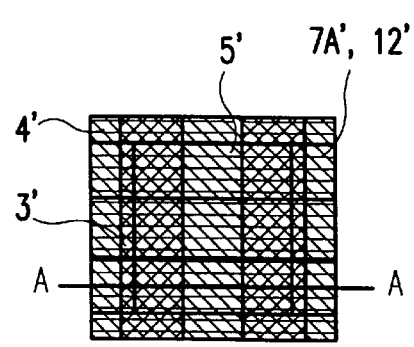
FIG. 9 is a partial ABS view of the slider taken along plane 9—9 of FIG. 7 to show the read and write elements of the merged magnetic head.
Figure 9B:
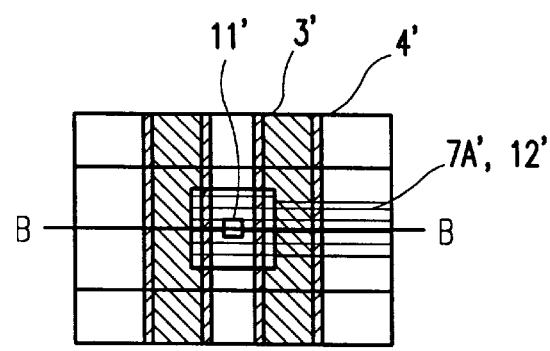
Figure 11B:
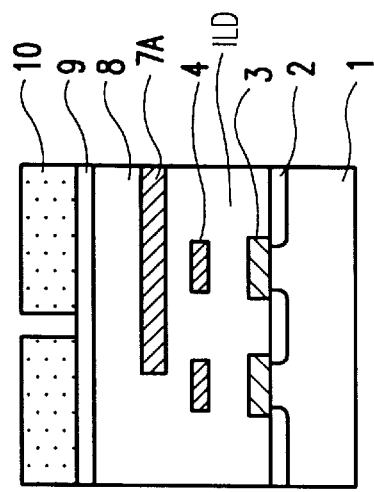
FIG. 11 is an isometric ABS illustration of a read head which employs an AP pinned spin valve (SV) sensor.
Figure 12B:
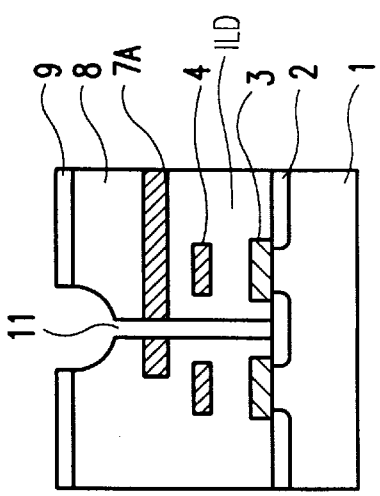
FIG. 12 is an ABS illustration of an exemplary first spin valve sensor investigated by me.
Figure 11A:
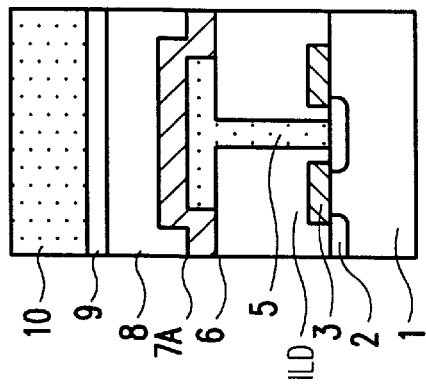
Figure 12A:
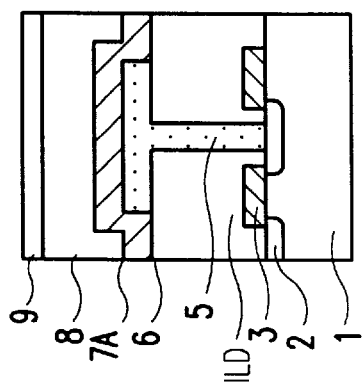
Figure 13A:
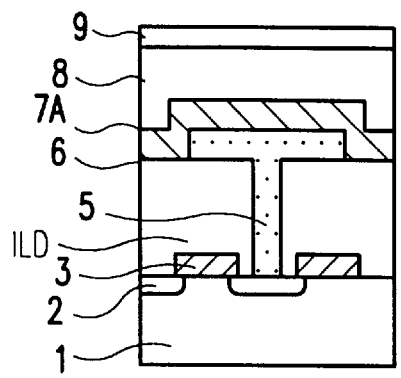
FIG. 13 is an ABS illustration of an exemplary second spin valve sensor investigated by me.
Figure 13B:
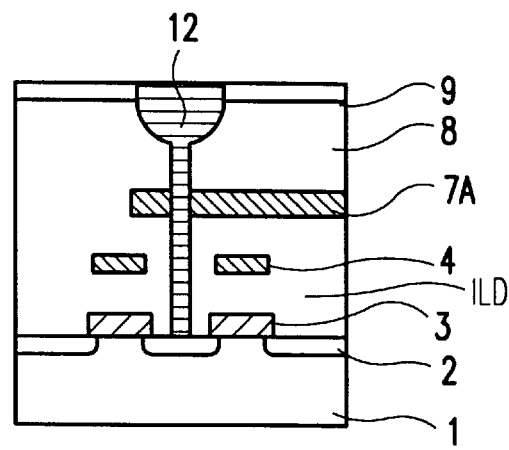
Figure 14A:
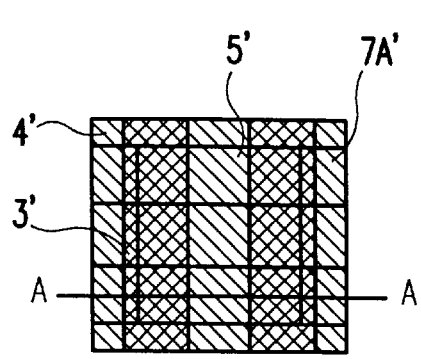
FIG. 14 is an ABS illustration of a first embodiment of the present spin valve sensor.
Figure 14B:
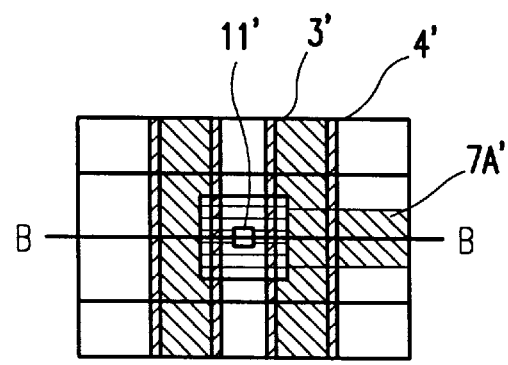
Figure 15A:
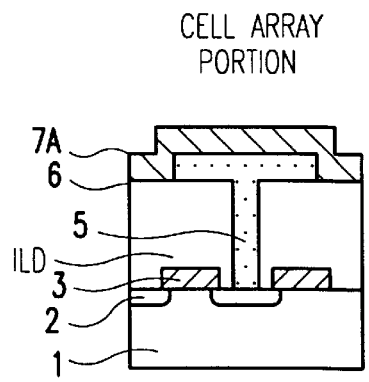
FIG. 15 is an ABS illustration of another spin valve sensor investigated by me.
Figure 15B:
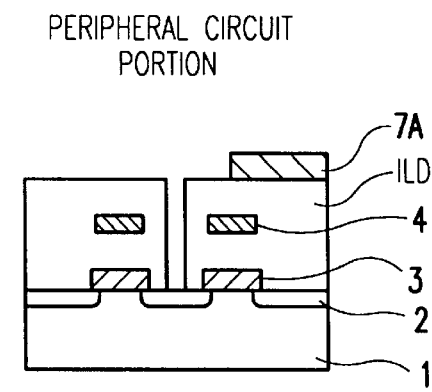
Figure 16A:
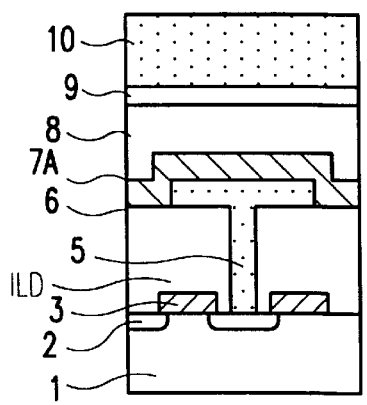
FIG. 16 is an ABS illustration of a second embodiment of the present invention.
Figure 16B:
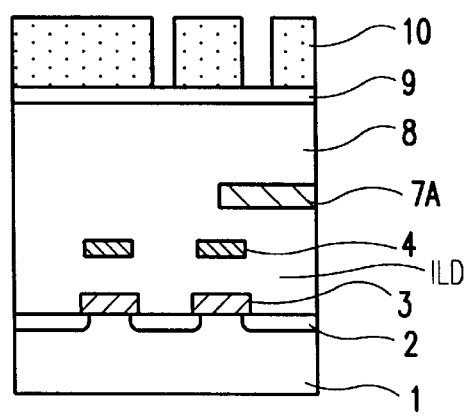
Figure 17A:
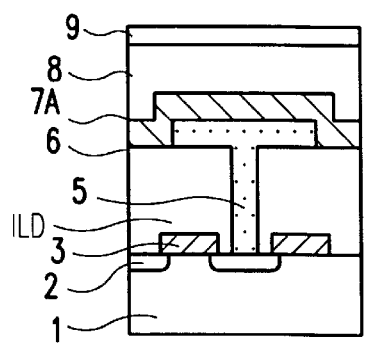
FIG. 17 is an antiparallel (AP) pinned layer structure.
Figure 17B:
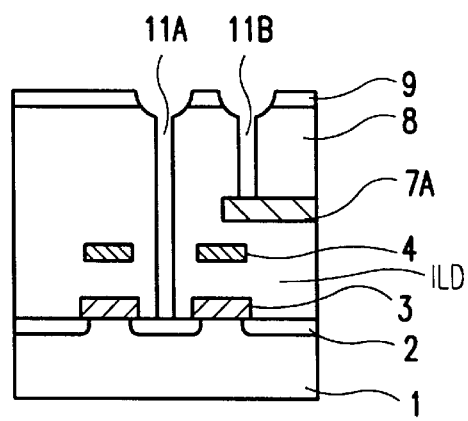
Figure 18A:
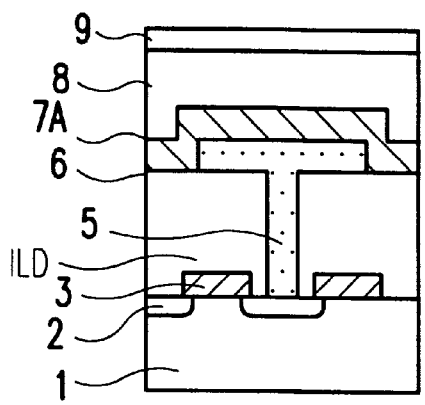
FIG. 18 is an ABS illustration of a single layer pinned layer structure.
Figure 18B:
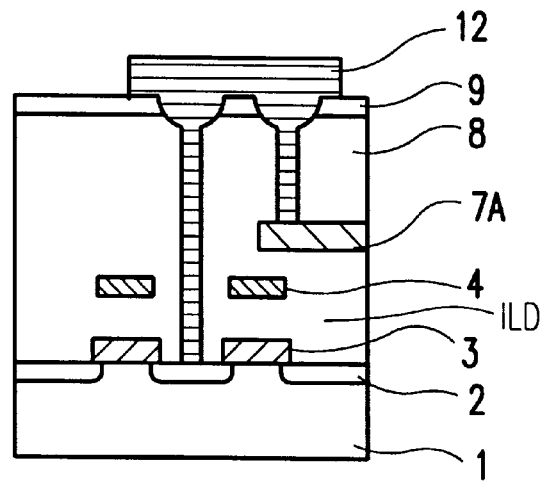
Figure 19A:
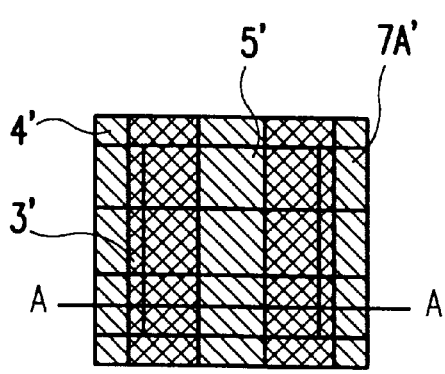
Figure 19B:
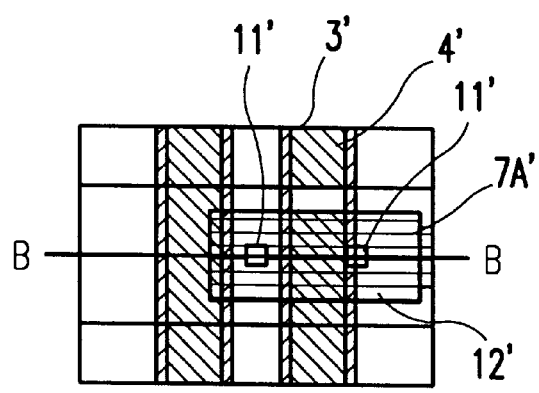
Figure 9:
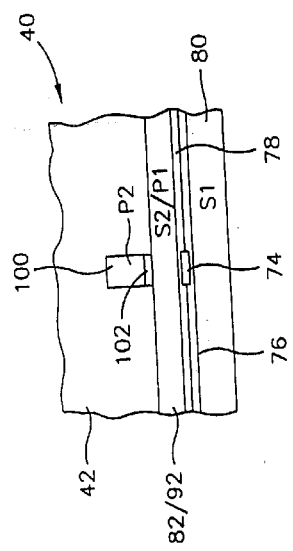

FIGS. 7 and 9 are the same as FIGS. 6 and 8 except the second shield layer 82 and the first pole piece layer 92 are a common layer. This type of head is known as a merged magnetic head. The insulation layer 103 of the piggyback head in FIGS. 6 and 8 is omitted.

Figure 11:
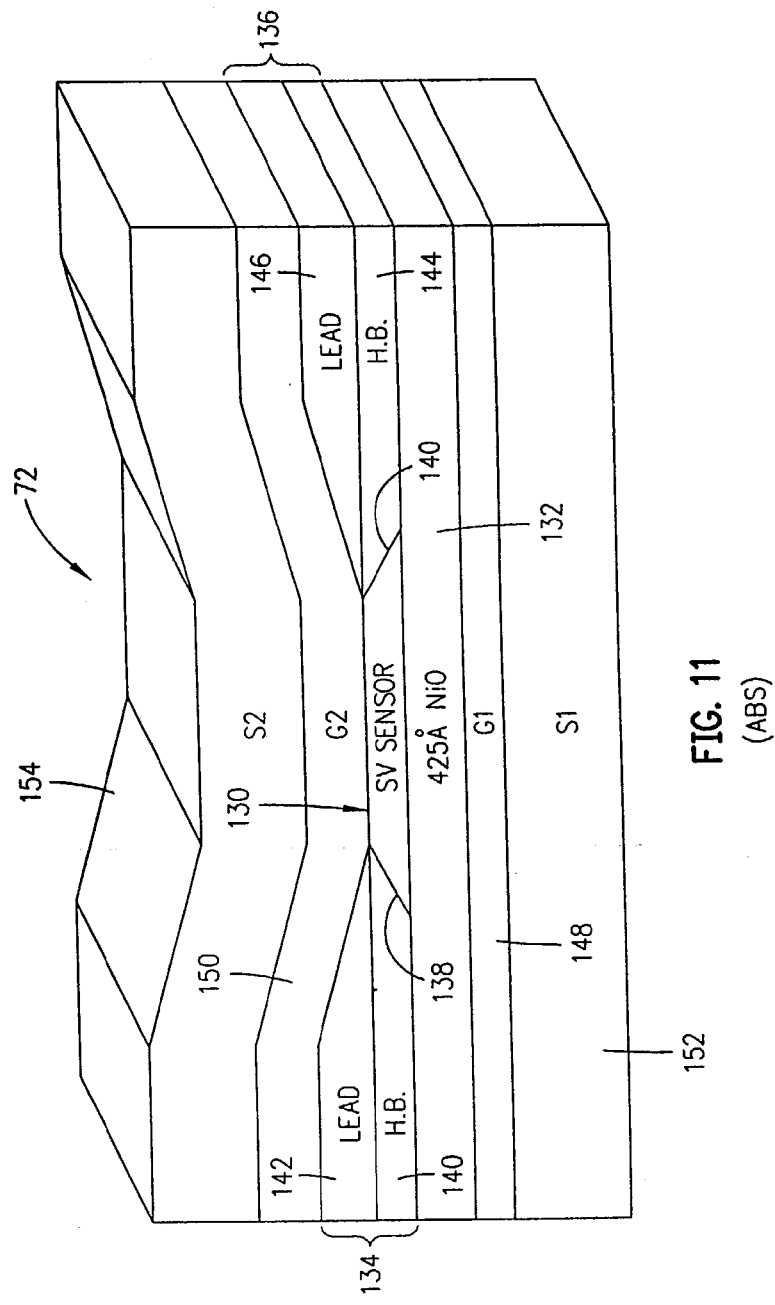

FIG. 11 is an isometric ABS illustration of the read head 72 shown in FIGS. 6 or 8. The read head 72 includes the present spin valve sensor 130 which is located on an antiferromagnetic (AFM) pinning layer 132. A ferromagnetic pinned layer in the spin valve sensor 130, which is to be described hereinafter, has a magnetic moment that is pinned by the magnetic spins of the pinning layer 132. The AFM pinning layer may be 425 Å of nickel oxide (NiO). First and second hard bias and lead layers 134 and 136 are connected to first and second side edges 138 and 140 of the spin valve sensor. This connection is known in the art as a contiguous junction and is fully described in commonly assigned U.S. Pat. No. 5,018,037 which is incorporated by reference herein. The first hard bias and lead layers 134 include a first hard bias layer 140 and a first lead layer 142 and the second hard bias and lead layers 136 include a second hard bias layer 144 and a second lead layer 146. The hard bias layers 140 and 144 cause magnetic fields to extend longitudinally through the spin valve sensor 130 for stabilizing the magnetic domains therein. The AFM pinning layer 132, the spin valve sensor 130 and the first and second hard bias and lead layers 134 and 136 are located between nonmagnetic electrically insulative first and second read gap layers 148 and 150. The first and second read gap layers 148 and 150 are, in turn, located between ferromagnetic first and second shield layers 152 and 154.

In the following five examples various tests were made wherein five spin valve sensors with AP pinned layers were evaluated for their magnetoresistive coefficients (dr/R) and thermal stabilities. The antiferromagnetic layer was nickel oxide (NiO) which was exchange coupled to the first AP pinned layer. Each of these parameters were tested after subjecting the spin valve sensor to a field of 9000 Oe oriented zero degrees or parallel to the easy axis of the magnetic moment of the first AP pinned layer of the AP pinned layer structure, followed by subjecting the sensor to 9000 Oe 90° to the easy axis of the magnetic moment of the first AP pinned layer, followed by 9000 Oe 180° to the easy axis of the magnetic moment of the first AP pinned layer and finally followed by 9000 Oe 270° to the easy axis of the magnetic moment of the first AP pinned layer. At each of these steps the magnetoresistive coefficient (dr/R) was measured and recorded. From the recorded magnetoresistive coefficient dr/R the coercivity $H_c$ of the pinned layer can be inferred. The application of the field of 9000 Oe 180° to the early axis is the most important since it is more severe than the 90° and 270° applications. Finally, the thermal stability of each spin valve sensor was evaluated by measuring the magnetoresistive coefficient (dr/R) of the spin valve sensor after being annealed at a temperature of 230° C. for six hours followed by resetting the pinning layer at 220° C. in the presence of a field of 10,000 Oe perpendicular to the ABS for 5–10 minutes. Examples three and five are first and second embodiments of the present invention.

EXAMPLE I

Figure 12:
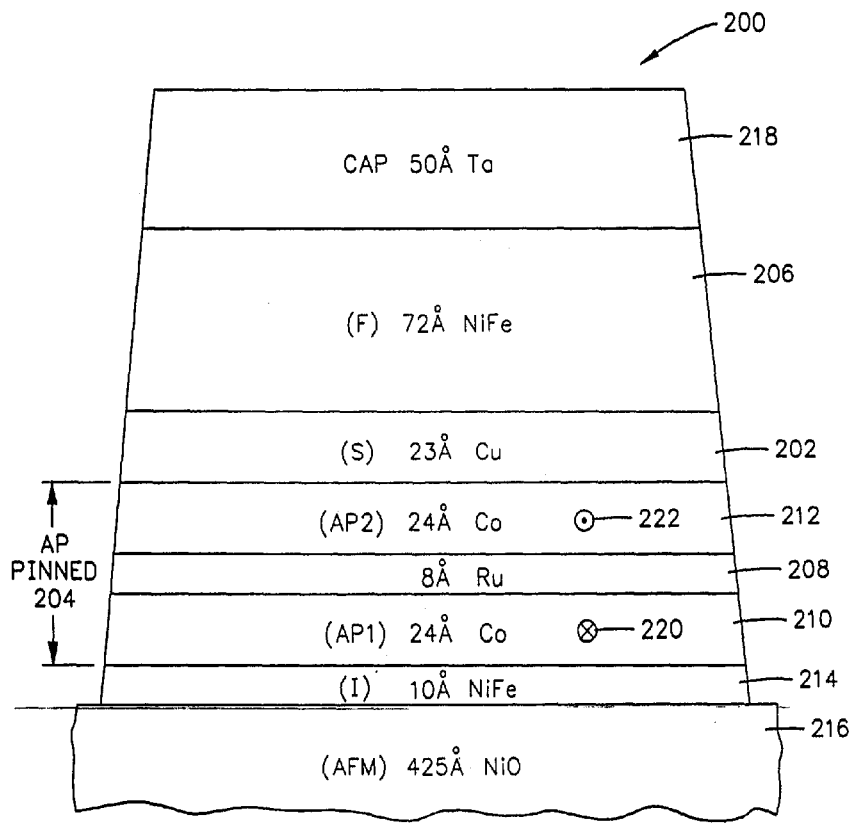

A first spin valve sensor 200 investigated by me is shown in FIG. 12. This sensor includes a nonmagnetic electrically conductive spacer layer (S) 202 which is located between an AP pinned layer structure 204 and a ferromagnetic free layer (F) 206. The spacer layer 202 was 23 Å of copper (Cu) and the free layer 206 was 72 Å of nickel iron (NiFe). The AP pinned layer structure 204 included an antiparallel (AP) coupling layer 208 located between a first antiparallel pinned layer (AP1) 210 and a second AP pinned layer (AP2) 212. The AP coupling layer 208 was 8 Å of ruthenium (Ru) and each of the first and second AP pinned layers 210 and 212 were 24 Å of cobalt (Co). An interlayer (I) 214 was located between an antiferromagnetic (AFM) pinning layer 216 and the first AP pinned layer 210. The interlayer 214 was 10 Å of nickel iron (NiFe) and the pinning layer 216 was 425 Å of nickel oxide (NiO). A capping layer of 50 Å of tantalum (Ta) was employed on top of the free layer 206 for protection purposes.

An exemplary direction for the magnetic moment of the first AP pinned layer 210 is into the paper, as shown at 220 in FIG. 12. This means that the magnetic moment of the second AP pinned layer 212 will be antiparallel thereto, namely out of the paper as shown at 222. When the first direction of the field of 9000 Oe was directed into the paper in the same direction as that shown at 220 the magnetoresistive coefficient (dr/R) of the spin valve sensor was 4.14%. When the spin valve sensor was subjected to the 9000 Oe field in a direction 90° to the direction 220 the magnetoresistive coefficient (dr/R) of the spin valve sensor was 4.13%. When the spin valve sensor was subjected to the field of 9000 Oe in a direction 180° to the direction 220 the magnetoresistive coefficient (dr/R) dropped slightly to 3.86%. This indicates that the coercivity ($H_c$) of the first AP pinned layer was lower than the exchange coupling field. Finally, when the spin valve sensor was subjected to the field of 9000 Oe 270° to the direction 220 the magnetoresistive coefficient (dr/R) increased to 4.14% which is the same as the magnetoresistive coefficient (dr/R) in the first step. After the aforementioned annealing the magnetoresistive coefficient (dr/R) was 3.60%. The results of this testing are shown in Chart A hereinbelow.

EXAMPLE II

Figure 13:
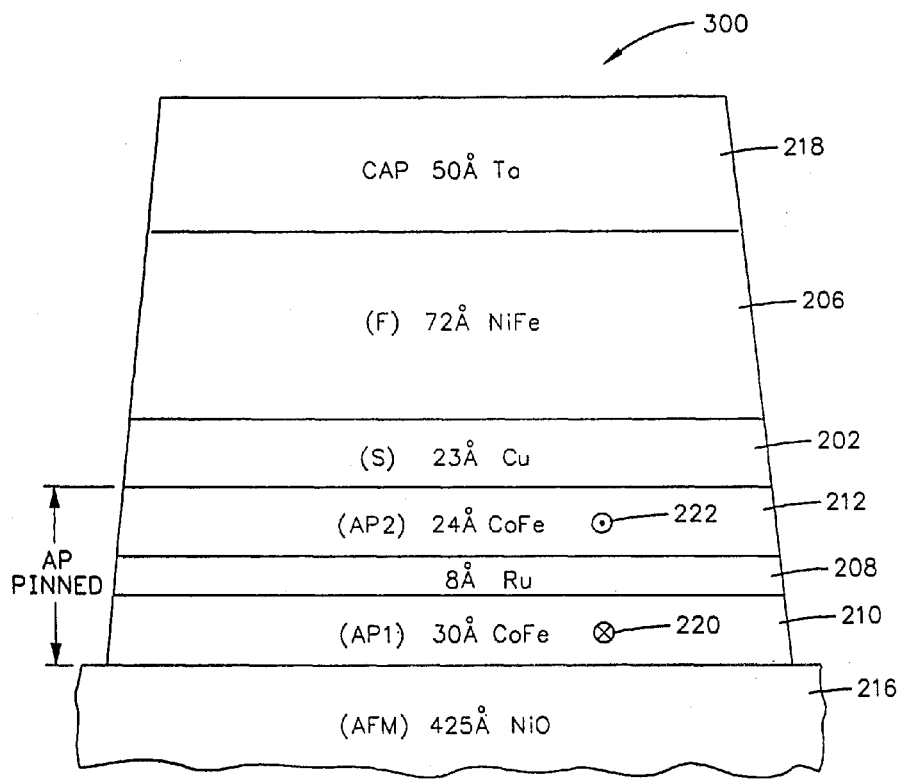

The second spin valve sensor tested by me is shown at 300 in FIG. 13. This spin valve sensor is the same as the spin valve sensor 200 shown in FIG. 12 except the interlayer 214 was not employed, the first AP pinned layer 210 was 30 Å of cobalt iron (CoFe) and the second AP pinned layer 214 was 24 Å of cobalt iron (CoFe). Cobalt iron (CoFe) is preferred over cobalt (Co) for the first and second AP pinned layers 210 and 212 of the AP pinned layer structure, since cobalt iron (CoFe) has lower magnetostriction and higher resistance, as discussed hereinabove.

After subjecting the spin valve sensor 300 to the field of 9000 Oe parallel to the direction of the magnetic moment 220 in FIG. 13, the magnetoresistive coefficient (dr/R) was 4.47%. After subjecting the spin valve sensor to the field of 9000 Oe 90° to the magnetic moment 220 the magnetoresistive coefficient (dr/R) was 4.52%. After subjecting the spin valve sensor 300 in FIG. 13 to the field of 9000 Oe 180° to the magnetic moment 220 in FIG. 13 the magnetoresistive coefficient (dr/R) dropped considerably to 2.22%. Finally, after subjecting the spin valve sensor 300 to the field of 9000 Oe in a direction 270° to the magnetic moment 220 the magnetoresistive coefficient (dr/R) increased significantly to 4.45%. After the aforementioned annealing step the magnetoresistive coefficient (dr/R) was 4.20%. The results are shown in Chart A.

The spin valve sensor 300 in FIG. 13 had improved magnetoresistive coefficient (dr/R) over the spin valve sensor 200 shown in FIG. 12. However, when the spin valve sensor 300 was subjected to the field of 9000 Oe 180° to the magnetic moment 220 the magnetoresistive coefficient (dr/R) dropped by 50%. This is because the magnetic moment of the first AP pinned layer 210 in FIG. 13 had been relocated to another direction and the exchange coupling field between the pinning layer 216 and the AP pinned layer 210 was not sufficient to overcome the coercivity ($H_c$) of the pinned layer 210 to bring the AP pinned layer back to its original position shown at 220.

EXAMPLE III

First Embodiment of the Invention

Figure 14:
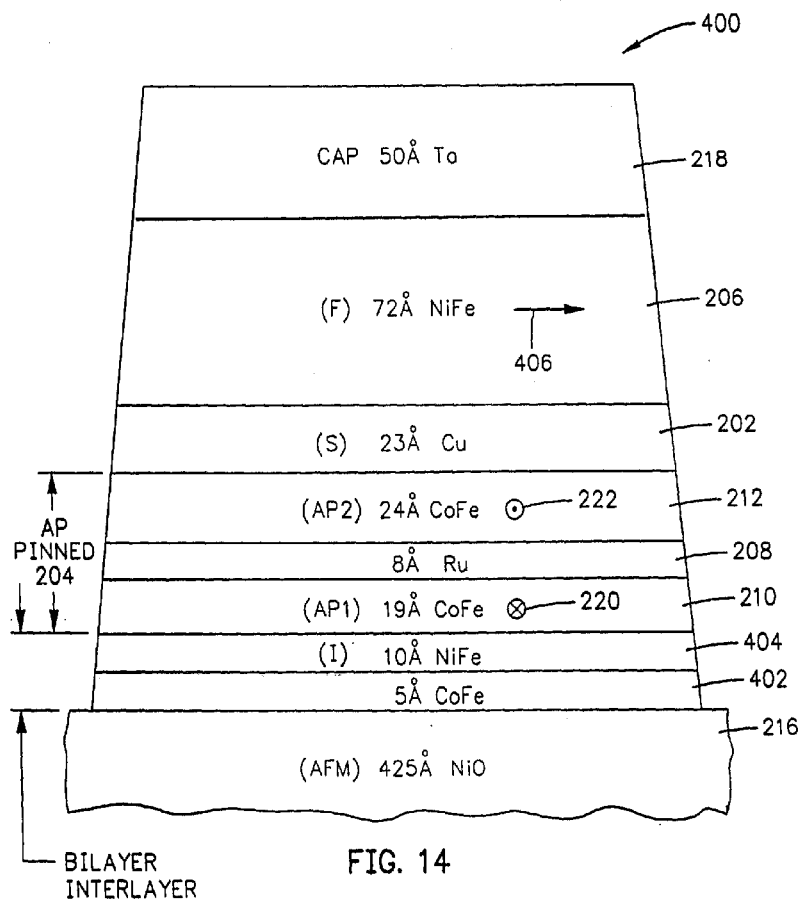

A first embodiment of the present invention is the spin valve sensor 400 shown in FIG. 14. This spin valve sensor is the same as the spin valve sensor 300 shown in FIG. 13 except the first AP pinned layer 210 was 19 Å of cobalt iron (CoFe) and a bilayer structure comprising first and second layers 402 and 404 was employed between the pinning layer 216 and the first AP pinned layer 210. The first layer 402 of the bilayer interlayer structure was 5 Å of cobalt iron (CoFe) and the second layer thereof was 10 Å of nickel iron (NiFe).

The spin valve sensor 400 in FIG. 14 was then subjected to the field of 9000 Oe directed parallel to the magnetic moment 220 of the first AP pinned layer 210. The magnetoresistive coefficient (dr/R) was 4.6%. When the spin valve sensor 400 was subjected to a field of 9000 Oe directed 90° to the magnetic moment 220 the magnetoresistive coefficient (dr/R) was 4.62%. When the spin valve sensor 400 was subjected to a field of 9000 Oe directed 180° to the magnetic moment 220 the magnetoresistive coefficient (dr/R) was 3.96%. Finally, when the spin valve sensor 400 was subjected to the field of 9000 Oe directed 270° to the magnetic moment 220 the magnetoresistive coefficient (dr/R) was 4.57%. After the aforementioned annealing the magnetoresistive coefficient (dr/R) was 4.40%. The results of this testing are shown in Chart A hereinbelow.

It can be seen that the magnetoresistive coefficient (dr/R) of the spin valve sensor 400 at each of the steps of testing with a field of 9000 Oe was greater than the magnetoresistive coefficient (dr/R) of each of the spin valve sensors 200 and 300 in FIGS. 12 and 13 at the same steps. In particular, it should be noted that when the spin valve sensor 400 was subjected to the field of 9000 Oe 180° to the magnetic moment 220 its magnetoresistive coefficient (dr/R) was significantly greater than the magnetoresistive coefficient (dr/R) of the spin valve sensor 300 in FIG. 13 when subjected to the same field. This is because the bilayer interlayer structure comprising the layers 402 and 404 in FIG. 14 significantly reduced the coercivity ($H_c$) of the first AP pinned layer 210.

EXAMPLE IV

Figure 15:
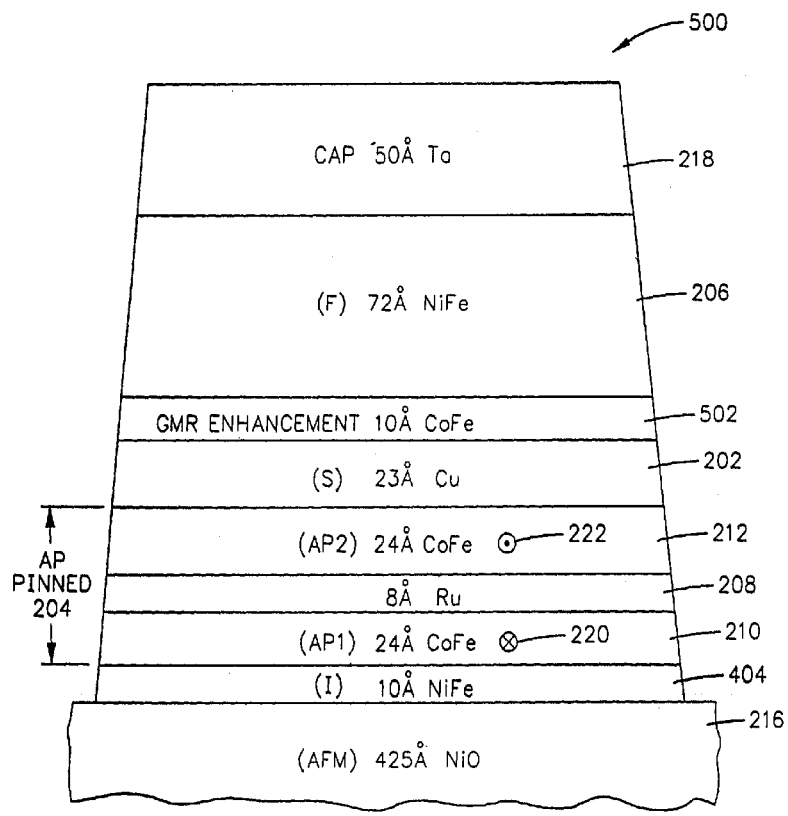

The spin valve sensor 500 shown in FIG. 15 is the same as the spin valve sensor 400 in FIG. 14 except the cobalt iron (CoFe) layer 402 in FIG. 14 has been omitted and a GMR enhancement layer 502, which in a preferred embodiment is 10 Å of cobalt iron (CoFe), has been added between the spacer layer 202 and the free layer 206. The layer 502 is sometimes referred to as a nanolayer and is employed for increasing the magnetoresistive coefficient (dr/R) of the spin valve sensor.

The spin valve sensor 500 was subjected to a field of 9000 Oe directed parallel to the magnetic moment 220 of the first AP pinned layer 210. The magnetoresistive coefficient (dr/R) was 6.%. Next the spin valve sensor 500 was subjected to a field of 9000 Oe directed 90° to the magnetic moment 220 and the magnetoresistive coefficient (dr/R) was 6.0%. Next, the spin valve sensor 500 was subjected to a field of 9000 Oe directed 180° to the magnetic moment 220 and the magnetoresistive coefficient (dr/R) was then 5.7%. Finally, the spin valve sensor 500 was subjected to a field of 9000 Oe directed 270° to the magnetic moment 220 and the magnetoresistive coefficient (dr/R) was 6.0%. After the aforementioned annealing the magnetoresistive coefficient (dr/R) was 5.60%. The results of this testing are shown in Chart A hereinbelow.

It can be seen that the magnetoresistive coefficient (dr/R) of the spin valve sensor 500 at each of the steps of testing with a field of 9000 Oe was greater than the magnetoresistive coefficient (dr/R) of each of the spin valve sensors 200, 300 and 400 in FIGS. 12, 13 and 14 respectively. This is due to the GMR enhancement layer 502.

EXAMPLE V

Second Embodiment of the Invention

Figure 16:
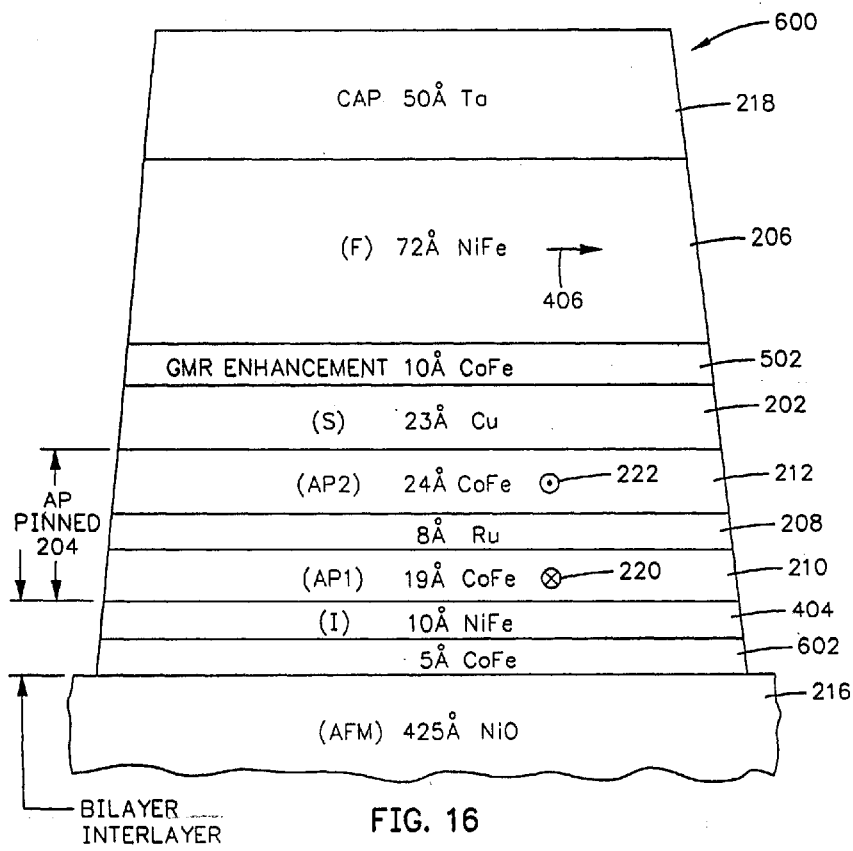

The spin valve sensor 600 in FIG. 16 is the same as the spin valve sensor 500 in FIG. 15 except a layer 602, which is 5 Å of cobalt iron (CoFe), is employed between the pinning layer 216 and the nickel iron (NiFe) layer 404.

The spin valve sensor 600 in FIG. 16 was subjected to a field of 9000 Oe directed parallel to the magnetic moment 220 of the first AP pinned layer 210 and the magnetoresistive coefficient (dr/R) was 6.7%. Next, the spin valve sensor 600 was subjected to a field of 9000 Oe directed 90° to the magnetic moment 220 and the magnetoresistive coefficient (dr/R) was 6.65%. Next, the spin valve sensor 600 was subjected to a field of 9000 Oe directed 180° to the magnetic moment 220 and the magnetoresistive coefficient (dr/R) was 6.3%. Finally, the spin valve sensor 600 was subjected to the field of 9000 Oe directed 270° to the magnetic moment 220 and the magnetoresistive coefficient (dr/R) was 6.6%. After the aforementioned annealing the magnetoresistive coefficient (dr/R) was 6.50%. The results of this testing are shown in Chart A hereinbelow.

It can be seen from a comparison of Examples IV and V that the magnetoresistive coefficient (dr/R) of the invention in Example V is significantly increased over the magnetoresistive coefficient (dr/R) of the example 500 in FIG. 15.

CHART A

| Spin Valve | I dr/R | II dr/R | III dr/R | IV dr/R | V dr/R |
|---|---|---|---|---|---|
| Initial - 0 degree field (9,000 Oe) | 4.14% | 4.47% | 4.60% | 6.1% | 6.7% |
| 90° field (9,000 Oe) | 4.13% | 4.52% | 4.62% | 6.0% | 6.65% |
| 180° field (9,000 Oe) | 3.86% | 2.22% | 3.96% | 5.7% | 6.3% |

CHART A-continued

| Spin Valve | I dr/R | II dr/R | III dr/R | IV dr/R | V dr/R |
|---|---|---|---|---|---|
| 270° field (9,000 Oe) | 4.14% | 4.45% | 4.57% | 6.0% | 6.6% |
| Annealing and resetting after 180° field | 3.6% | 4.2% | 4.4% | 5.6% | 6.5% |

It should be understood that the bilayer interlayer structure comprising the first and second layers 402 and 404 in FIGS. 14 and 16 are essentially part of the first AP pinning layer 210 since they are exchange coupled thereto as well as being exchange coupled to the pinning layer 216. Further, since the first and second layers 402 and 404 of the bilayer interlayer structure can be considered a part of the first AP pinned layer 210, the first AP pinned layer 210 may have a reduced thickness which is shown as 19 Å in FIGS. 14 and 16. In comparison, the first AP pinned layer 210 of the spin valve sensor 300 in FIG. 13 was 24 Å. It should also be understood that the magnetic moments of the first and second layers 402 and 404 of the bilayer interlayer structure will be in the same direction as the first AP pinned layer 210, namely in the same direction as the magnetic moment 220 shown in FIG. 14. It should be further understood that the second AP pinned layer 212 in all examples does not have its coercivity ($H_c$) altered by the nickel oxide pinning layer 216. This is because the second AP pinned layer 212 is not directly exchange coupled to the pinning layer 216. However, the second AP pinned layer 212 is antiparallel exchange coupled to the first AP pinned layer 210 which causes its magnetic moment to be antiparallel to the magnetic moment 220, as shown at 222. It is the relative direction between the magnetic moment 222 and the magnetic moment of the free layer 200 which determines the magnetoresistance of the spin valve sensor. The magnetic moment of the free layer 200 is typically oriented parallel to the ABS, as shown at 406 in FIGS. 14 and 16.

The composition of all the cobalt iron (CoFe) layers in the examples was $Co_{90}Fe_{10}$ except Example I. The nickel iron (NiFe) layers in the examples were $Ni_{82}Fe_{18}$. It should be understood that these percentages can be changed without departing from the spirit of the invention. Further, the thicknesses of the layers may be different than that shown in FIGS. 14 and 16 without departing from the spirit of the invention. For instance, the first and second layers 402 and 404 of the bilayer interlayer structure may be less or greater than that shown in FIGS. 14 and 16. In the preferred embodiment the first layer 402 is 5 Å thick and the second layer 404 is 10 Å thick. Still further, the preferred pinning layer 216 is nickel oxide (NiO). However, it should be understood that other antiferromagnetic materials may be used, such as nickel manganese (NiMn), platinum manganese (PtMn) or iridium manganese (IrMn).

Figure 17:
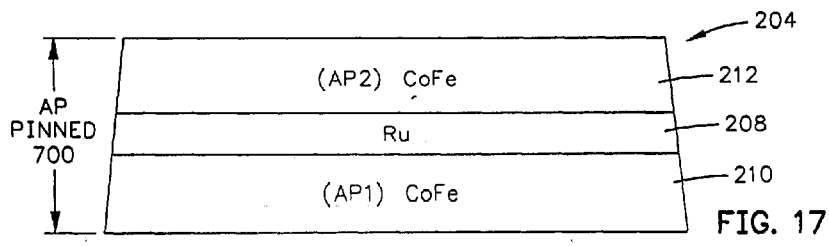
Figure 16:
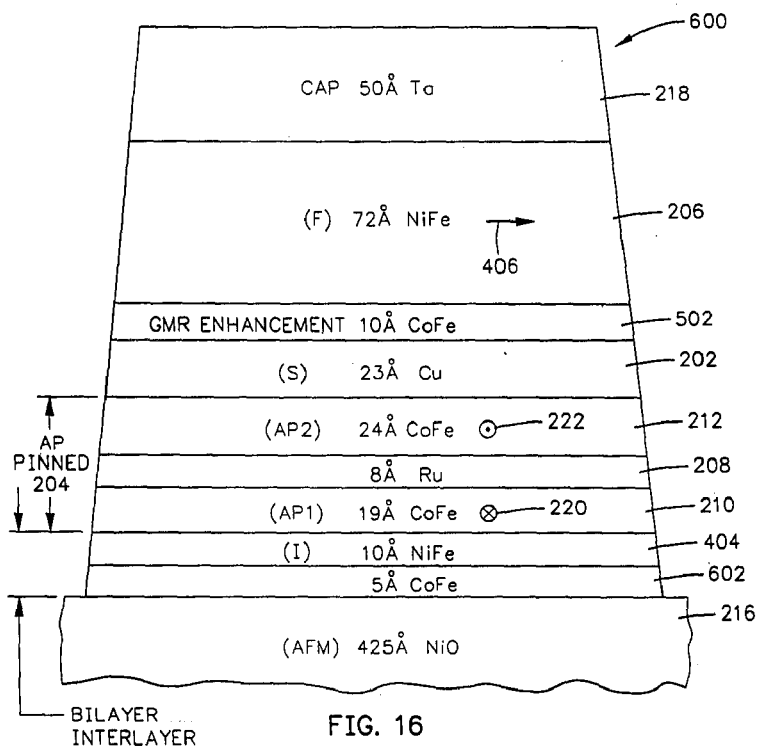
Figure 17:
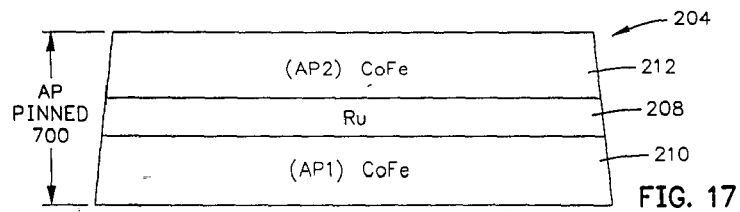

FIG. 17 is an ABS illustration of the AP pinned layer structure 204 shown in FIGS. 14 and 16. An optional pinned layer structure is a single pinned layer (P) of cobalt iron (CoFe) shown at 700 in FIG. 18. The single pinned layer 700 may be substituted for the AP pinned layer structure 204 shown in FIGS. 14 and 16 as other embodiments of the present invention. The bilayer interlayer structure comprising the first and second layers 402 and 404 shown in FIGS. 14 and 16 will reduce the coercivity of the pinned layer 700 so that the exchange coupling field between the pinned layer 600 and the pinning layer 216 will return its magnetic

I claim:

1. A magnetic read head comprising:
    a spin valve sensor including:
        an antiferromagnetic pinning layer;
        a cobalt iron (CoFe) pinned layer structure;
        a bilayer interlayer structure having ferromagnetic first and second layers, the first layer being cobalt iron (CoFe) and the second layer being nickel iron (NiFe);
        the bilayer interlayer structure being located between the pinning layer and the pinned layer structure with the first layer interfacing the pinning layer and the second layer interfacing the pinned layer structure;
        the pinned layer structure having a magnetic moment pinned by the pinning layer in a first direction;
        a ferromagnetic free layer; and
        a nonmagnetic electrically conductive spacer layer located between the pinned layer structure and the free layer.

2. A magnetic read head as claimed in claim 1 including:
    first and second hard bias and lead layers connected to first and second side edges of the spin valve sensor;
    nonmagnetic electrically insulative first and second read gap layers;
    the spin valve sensor and the first and second hard bias and lead layers being located between the first and second read gap layers;
    ferromagnetic first and second shield layers;
    the first and second read gap layers being located between the first and second shield layers.

3. A magnetic read head as claimed in claim 2 wherein the pinned layer structure includes:
    ferromagnetic first and second antiparallel layers of cobalt iron (CoFe); and
    a ruthenium (Ru) antiparallel coupling layer located between the first and second antiparallel layers.

4. A magnetic read head as claimed in claim 2 wherein the pinned layer structure includes a single ferromagnetic layer of cobalt iron (CoFe).

5. A magnetic read head as claimed in claim 2 including:
    a cobalt iron (CoFe) GMR enhancement layer between the spacer layer and the free layer.

6. A magnetic read head as claimed in claim 2 wherein the pinning layer is nickel oxide (NiO).

7. A magnetic read head as claimed in claim 6 wherein the pinned layer structure includes:
    ferromagnetic first and second antiparallel layers of cobalt iron (CoFe); and
    a ruthenium (Ru) antiparallel coupling layer located between the first and second antiparallel layers.

8. A magnetic read head as claimed in claim 7 including:
    a cobalt iron (CoFe) GMR enhancement layer between the spacer layer and the free layer.

9. A magnetic read head as claimed in claim 6 wherein the pinned layer structure includes a single ferromagnetic layer of cobalt iron (CoFe).

10. A magnetic read head as claimed in claim 9 including:
    a cobalt iron (CoFe) GMR enhancement layer between the spacer layer and the free layer.

11. A magnetic head assembly having a read head and a write head comprising:
    the write head including:
        first and second pole piece layers;
        each of the first and second pole piece layers having a yoke portion located between a pole tip portion and a back gap portion;
        a nonmagnetic write gap layer located between the pole tip portions of the first and second pole piece layers;
        an insulation stack with at least one coil layer embedded therein located between the yoke portions of the first and second pole piece layers; and
        the first and second pole piece layers being connected at their back gap portions; and
    the read head including:
        nonmagnetic electrically insulative first and second read gap layers;
        a spin valve sensor;
        first and second hard bias and lead layers connected to the spin valve sensor;
        the spin valve sensor and the first and second hard bias and lead layers being located between the first and second read gap layers;
        a first shield layer;
        the first and second read gap layers being located between the first shield layer and the first pole piece layer; and
    the spin valve sensor including:
        an antiferromagnetic pinning layer;
        a cobalt iron (CoFe) pinned layer structure;
        a bilayer interlayer having ferromagnetic first and second layers, the first layer being cobalt iron (CoFe) and the second layer being nickel iron (NiFe);
        the bilayer interlayer being located between the pinning layer and the pinned layer structure with the first layer interfacing the pinning layer and the second layer interfacing the pinned layer structure;
        the pinned layer structure having a magnetic moment pinned by the pinning layer in a first direction;
        a ferromagnetic free layer; and
        a nonmagnetic electrically conductive spacer layer located between the pinned layer structure and the free layer.

12. A magnetic head assembly as claimed in claim 11 wherein the pinned layer structure includes:
    ferromagnetic first and second antiparallel layers of cobalt iron (CoFe); and
    a ruthenium (Ru) antiparallel coupling layer located between the first and second antiparallel layers.

13. A magnetic head assembly as claimed in claim 11 wherein the pinned layer structure includes a single ferromagnetic layer of cobalt iron (CoFe).

14. A magnetic head assembly as claimed in claim 11 including:
    a cobalt iron (CoFe) GMR enhancement layer between the spacer layer and the free layer.

15. A magnetic head assembly as claimed in claim 11 wherein the pinning layer is nickel oxide (NiO).

16. A magnetic head assembly as claimed in claim 15 wherein the pinned layer structure includes:
    ferromagnetic first and second antiparallel layers of cobalt iron (CoFe); and
    a ruthenium (Ru) antiparallel coupling layer located between the first and second antiparallel layers.

17. A magnetic head assembly as claimed in claim 16 including:
   a cobalt iron (CoFe) GMR enhancement layer between the spacer layer and the free layer.

18. A magnetic head assembly as claimed in claim 15 wherein the pinned layer structure includes a single ferromagnetic layer of cobalt iron (CoFe).

19. A magnetic head assembly as claimed in claim 18 including:
   a cobalt iron (CoFe) GMR enhancement layer between the spacer layer and the free layer.

20. A magnetic disk drive that includes at least one slider that has an air bearing surface (ABS), the slider supporting at least one magnetic head assembly that includes a read head and a write head, the disk drive comprising:
   the write head including:
      first and second pole piece layers;
      each of the first and second pole piece layers having a yoke portion located between a pole tip portion and a back gap portion;
      a nonmagnetic write gap layer located between the pole tip portions of the first and second pole piece layers;
      an insulation stack with at least one coil layer embedded therein located between the yoke portions of the first and second pole piece layers; and
      the first and second pole piece layers being connected at their back gap portions; and
   the read head including:
      nonmagnetic electrically insulative first and second read gap layers;
      a spin valve sensor;
      first and second hard bias and lead layers connected to the spin valve sensor;
      the spin valve sensor and the first and second hard bias and lead layers being located between the first and second read gap layers;
      a first shield layer;
      the first and second read gap layers being located between the first shield layer and the first pole piece layer; and
   the spin valve sensor including:
      an antiferromagnetic pinning layer;
      a cobalt iron (CoFe) pinned layer structure;
      a bilayer interlayer having ferromagnetic first and second layers, the first layer being cobalt iron (CoFe) and the second layer being nickel iron (NiFe);
      the bilayer interlayer being located between the pinning layer and the pinned layer structure with the first layer interfacing the pinning layer and the second layer interfacing the pinned layer structure;
      the pinned layer structure having a magnetic moment pinned by the pinning layer in a first direction;
      a ferromagnetic free layer; and
      a nonmagnetic electrically conductive spacer layer located between the pinned layer structure and the free layer; and
   a housing;
   a magnetic disk rotatably supported in the housing;
   a support mounted in the housing for supporting the magnetic head assembly with said ABS facing the magnetic disk so that the magnetic head assembly is in a transducing relationship with the magnetic disk;
   means for rotating the magnetic disk;
   positioning means connected to the support for moving the magnetic head assembly to multiple positions with respect to said magnetic disk; and
   processing means connected to the magnetic head assembly, to the means for rotating the magnetic disk and to the positioning means for exchanging signals with the magnetic head assembly, for controlling rotation of the magnetic disk and for controlling the position of the magnetic head assembly.

21. A magnetic disk drive as claimed in claim 20 wherein the pinning layer is nickel oxide (NiO).

22. A magnetic disk drive as claimed in claim 21 wherein the pinned layer structure includes:
   ferromagnetic first and second antiparallel layers of cobalt iron (CoFe); and
   a ruthenium (Ru) antiparallel coupling layer located between the first and second antiparallel layers.

23. A magnetic disk drive as claimed in claim 22 including:
   a cobalt iron (CoFe) GMR enhancement layer between the spacer layer and the free layer.

24. A magnetic disk drive as claimed in claim 21 wherein the pinned layer structure includes a single ferromagnetic layer of cobalt iron (CoFe).

25. A magnetic disk drive as claimed in claim 24 including:
   a cobalt iron (CoFe) GMR enhancement layer between the spacer layer and the free layer.

26. A method of making a magnetic head assembly that includes a read head and a write head comprising the steps of:
   making a spin valve sensor of the read head as follows:
      forming an antiferromagnetic pinning layer;
      forming a ferromagnetic bilayer interlayer on the pinning layer by forming a cobalt iron (CoFe) first layer on the pinning layer and forming a nickel iron (NiFe) second layer on the first layer;
      forming a cobalt iron (CoFe) pinned layer structure on the first layer of the bilayer interlayer;
      forming a nonmagnetic electrically conductive spacer layer on the pinned layer structure; and
      forming a ferromagnetic free layer on the spacer layer.

27. A method as claimed in claim 26 including:
   forming a ferromagnetic first shield layer;
   forming a nonmagnetic electrically insulative first read gap layer on the first shield layer;
   forming the spin valve sensor on the first read gap layer;
   connecting first and second hard bias and lead layers to first and second side edges of the spin valve sensor;
   forming a nonmagnetic electrically insulative second read gap layer on the spin valve sensor and the first and second hard bias and lead layers; and
   forming a ferromagnetic second shield layer on the second read gap layer.

28. A method as claimed in claim 27 wherein a making of the write head includes:
   forming a nonmagnetic separation layer on the second shield layer;
   forming a ferromagnetic first pole piece layer on the separation layer that has a yoke region located between a pole tip region and a back gap region;
   forming an insulation stack with at least one coil layer embedded therein on the first pole piece layer in the yoke region;
   forming a nonmagnetic write gap layer on the first pole piece layer in the pole tip region; and
   forming a ferromagnetic second pole piece layer on the write gap layer, the insulation stack and connected to the first pole piece layer in the back gap region.

29. A method as claimed in claim 28 including:
forming the pinning layer of nickel oxide (NiO).

30. A method as claimed in claim 29 wherein the forming of the pinned layer structure includes:
forming a cobalt iron (CoFe) first antiparallel layer on the second layer of the bilayer interlayer;
forming a ruthenium (Ru) antiparallel coupling layer on the first antiparallel layer; and
forming a cobalt iron (CoFe) second antiparallel layer on the antiparallel coupling layer.

31. A method as claimed in claim 30 including:
forming a cobalt iron (CoFe) GMR enhancement layer between the spacer layer the free layer.

32. A method as claimed in claim 29 wherein the pinned layer structure is formed of a single cobalt iron (CoFe) layer that interfaces the second layer of the bilayer interlayer.

33. A method as claimed in claim 32 including:
forming a cobalt iron (CoFe) GMR enhancement layer between the spacer layer the free layer.

34. A method as claimed in claim 27 wherein the making of the write head includes:
employing the first shield layer as a first pole piece layer with a yoke region located between a pole tip region and a back gap region;
forming an insulation stack with at least one coil layer embedded therein on the first pole piece layer in the yoke region;
forming a nonmagnetic write gap layer on the first pole piece layer in the pole tip region; and
forming a ferromagnetic second pole piece layer on the write gap layer, the insulation stack and connected to the first pole piece layer in the back gap region.

35. A method as claimed in claim 34 including:
forming the pinning layer of nickel oxide (NiO).

36. A method as claimed in claim 35 wherein the forming of the pinned layer structure includes:
forming a cobalt iron (CoFe) first antiparallel layer on the second layer of the bilayer interlayer;
forming a ruthenium (Ru) antiparallel coupling layer on the first antiparallel layer; and
forming a cobalt iron (CoFe) second antiparallel layer on the antiparallel coupling layer.

37. A method as claimed in claim 36 including:
forming a cobalt iron (CoFe) GMR enhancement layer between the spacer layer the free layer.

38. A method as claimed in claim 35 wherein the pinned layer structure is formed of a single cobalt iron (CoFe) layer that interfaces the second layer of the bilayer interlayer.

39. A method as claimed in claim 38 including:
forming a cobalt iron (CoFe) GMR enhancement layer between the spacer layer the free layer.

* * * * *

UNITED STATES PATENT AND TRADEMARK OFFICE
CERTIFICATE OF CORRECTION

PATENT NO.   : 6,201,672 B1
DATED        : March 13, 2001
INVENTOR(S)  : Pinarbasi It is certified that error appears in the above-identified patent and that said Letters Patent is hereby corrected as shown below:

The Title page showing an illustrative Fig. should be deleted and substitute therefor the attched title page.

<u>Drawings,</u>
Substitute accompanying Figs. 1-18 for Figs. 1A, 1B, 2A, 2B, 3A, 3B, 4A, 4B, 5A, 5B, 10A, 10B, 6A, 6B, 7A, 7B, 8A, 8B, 9A, 9B, 11A, 11B, 12A, 12B, 13A, 13B, 14A, 14B, 15A, 15B, 16A, 16B, 17A, 17B, 18A, 18B, 19A and 19B. Delete drawing sheets 1-9 and substitute therefor the drawing sheets consisting of Figs. 1-18.

Signed and Sealed this

Third Day of June, 2003

JAMES E. ROGAN
*Director of the United States Patent and Trademark Office*

(12) United States Patent
Pinarbasi

(10) Patent No.: US 6,201,672 B1
(45) Date of Patent: Mar. 13, 2001

(54) SPIN VALVE SENSOR HAVING IMPROVED INTERFACE BETWEEN PINNING LAYER AND PINNED LAYER STRUCTURE

(75) Inventor: Mustafa Pinarbasi, Morgan Hill, CA (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/299,336

(22) Filed: Apr. 26, 1999

(51) Int. Cl.⁷ .................................................. G11B 5/39
(52) U.S. Cl. ............................. 360/324.11; 360/324.1
(58) Field of Search ................................ 360/317, 324.1, 360/324.11, 324.12, 324.2

(56) References Cited

U.S. PATENT DOCUMENTS

| | | |
|---|---|---|
| 5,889,640 * | 3/1999 | Hayashi et al. ............... 360/324.1 |
| 5,909,345 * | 6/1999 | Kawawake et al. ........... 360/324.1 |
| 6,038,107 * | 3/2000 | Pinarbasi ...................... 360/324.11 |
| 6,040,961 * | 3/2000 | Gill ............................... 360/324.11 |
| 6,061,210 * | 5/2000 | Gill ............................... 360/324.12 |
| 6,108,177 * | 8/2000 | Gill ............................... 360/324.12 |

FOREIGN PATENT DOCUMENTS 11-74121 * 3/1999 (JP).

* cited by examiner

Primary Examiner—Jefferson Evans
(74) Attorney, Agent, or Firm—Gray Cary Ware & Freidenrich LLP; Ervin F. Johnston

(57) ABSTRACT

A bilayer interlayer comprising first and second layers of cobalt iron (CoFe) and nickel iron (NiFe) respectively is located between a nickel oxide pinning layer and a cobalt iron (CoFe) pinned layer structure of a spin valve sensor. The pinned layer structure may be an antiparallel (AP) pinned layer structure or a single pinned layer of cobalt iron (CoFe). The bilayer interlayer reduces the coercivity of the cobalt iron (CoFe) pinned layer structure so that a magnetic moment of the pinned layer structure is returned to its original position by exchange coupling with the pinning layer when the magnetic moment is rotated to some direction other than the pinned direction. The spin valve sensor manifests an improved magnetoresistive coefficient (dr/R) and thermal stability.

39 claims 10 Drawing Sheets

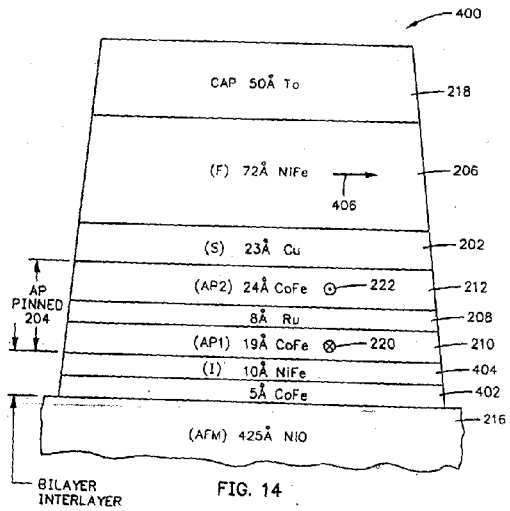

FIG. 14

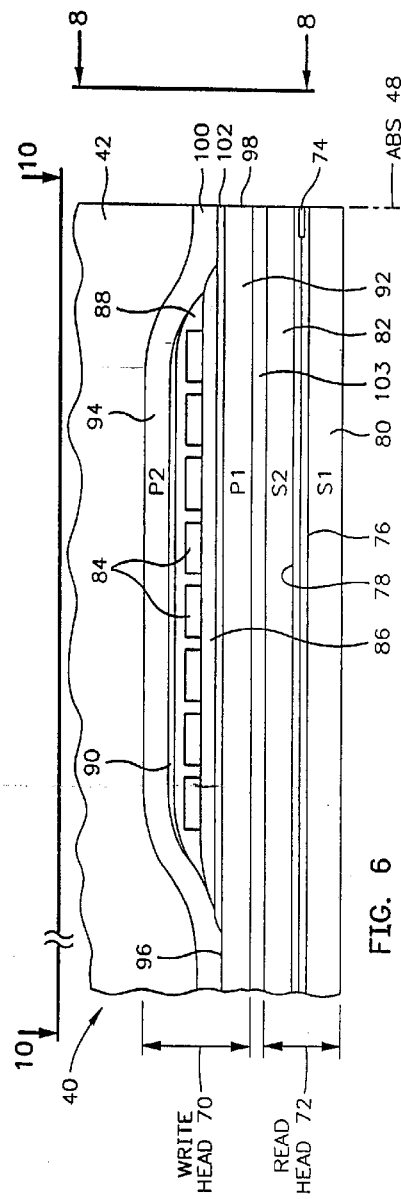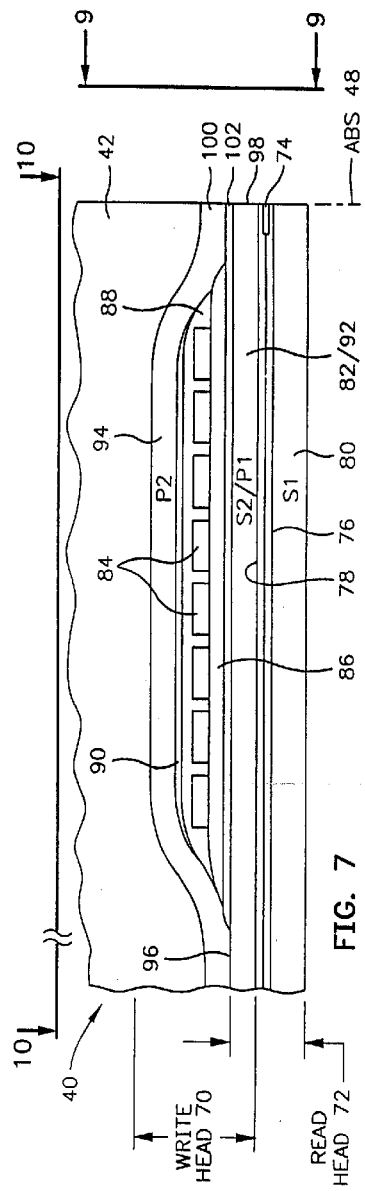

(ABS)

UNITED STATES PATENT AND TRADEMARK OFFICE
CERTIFICATE OF CORRECTION

Figure 18:
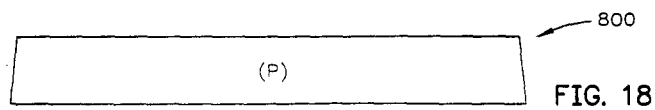

PATENT NO. : 6,201,672 B1
DATED : March 13, 2001
INVENTOR(S) : Mustafa Pinarbasi It is certified that error appears in the above-identified patent and that said Letters Patent is hereby corrected as shown below:

Drawings,
Please insert attached Figure 18 which was omitted in the issued patent.

Signed and Sealed this

Sixteenth Day of November, 2004

JON W. DUDAS
*Director of the United States Patent and Trademark Office*